US011244929B2

(12) United States Patent
Ueno et al.

(10) Patent No.: US 11,244,929 B2
(45) Date of Patent: Feb. 8, 2022

(54) LIGHT EMITTING DEVICE AND LIGHTING DEVICE

(71) Applicant: Sanken Electric Co., Ltd., Niiza (JP)

(72) Inventors: Takaya Ueno, Niiza (JP); Hitoshi Murofushi, Niiza (JP)

(73) Assignee: Sanken Electric Co., Ltd., Niiza (JP)

( * ) Notice: Subject to any disclaimer, the term of this patent is extended or adjusted under 35 U.S.C. 154(b) by 671 days.

(21) Appl. No.: 16/309,968

(22) PCT Filed: Oct. 30, 2017

(86) PCT No.: PCT/JP2017/039073
§ 371 (c)(1),
(2) Date: Dec. 14, 2018

(87) PCT Pub. No.: WO2019/087232
PCT Pub. Date: May 9, 2019

(65) Prior Publication Data
US 2021/0225814 A1     Jul. 22, 2021

(51) Int. Cl.
*F21K 9/00*     (2016.01)
*F21Y 113/13*     (2016.01)
(Continued)

(52) U.S. Cl.
CPC ............ *H01L 25/0753* (2013.01); *F21K 9/00* (2013.01); *F21Y 2113/13* (2016.08); *H01L 33/32* (2013.01); *H01L 33/504* (2013.01)

(58) Field of Classification Search
CPC ........................................................ F21K 9/00
See application file for complete search history.

(56) References Cited

U.S. PATENT DOCUMENTS 9,368,696 B1    6/2016   Murofushi et al.
2009/0095966 A1    4/2009   Keller et al.
(Continued)

FOREIGN PATENT DOCUMENTS

EP        2048718 A1     4/2009
JP      2008-34188 A     2/2008
(Continued)

OTHER PUBLICATIONS

The International Search Report (PCT/ISA/210) of PCT/JP2017/039073 dated Jan. 16, 2018 (English translation of the International Search Report will be issued and uploaded to PATENTSCOPE of WIPO.).

(Continued)

*Primary Examiner* — Alexander K Garlen
*Assistant Examiner* — Eric T Eide
(74) *Attorney, Agent, or Firm* — Metrolex IP Law Group, PLLC

(57) ABSTRACT

A light emitting device (1) includes: three or more light emitting units (10, 20, 30) that individually include blue light emitting element, a wavelength range of the blue light emitting element accommodated in respective packages being different from each other. The light emitting device mixes output lights from the light emitting units (10, 20, 30) to output white light of a predetermined chromaticity. In an xy chromaticity diagram, the chromaticity of the output light from each of light emitting units (10, 20, 30) is located at a distance from the predetermined chromaticity. The difference between the chromaticity of the output light from each of the light emitting units (10, 20, 30) and the predetermined chromaticity is not greater than 0.04.

8 Claims, 10 Drawing Sheets

(51) Int. Cl.
    *H01L 25/075*     (2006.01)
    *H01L 33/32*     (2010.01)
    *H01L 33/50*     (2010.01)

(56) References Cited

U.S. PATENT DOCUMENTS

| | | | |
|---|---|---|---|
| 2010/0002440 A1 | 1/2010 | Negley et al. | |
| 2013/0278134 A1* | 10/2013 | Ko | H01L 33/52 313/503 |
| 2018/0157120 A1* | 6/2018 | Okamoto | G02F 1/133603 |
| 2019/0021150 A1* | 1/2019 | Butendeich | F21K 9/00 |

FOREIGN PATENT DOCUMENTS

| | | | |
|---|---|---|---|
| JP | 2011-003594 A | 1/2011 | |
| JP | 2011-29497 A | 2/2011 | |
| JP | 2011-192738 A | 9/2011 | |
| JP | 2012-518293 A | 8/2012 | |
| JP | 2015-126160 A | 7/2015 | |
| JP | 2016-219519 A | 12/2016 | |
| WO | 2010/096288 A1 | 8/2010 | |
| WO | 2017/033288 A1 | 3/2017 | |

OTHER PUBLICATIONS

The Written Opinion (PCT/ISA/237) of PCT/JP2017/039073 dated Jan. 16, 2018 (English translation of the Written Opinion will be issued and uploaded to PATENTSCOPE of WIPO.).
The extended European search report dated Sep. 4, 2019 in a counterpart European patent application.
The office action dated Sep. 24, 2019 in a counterpart Japanese patent application.

\* cited by examiner

FIG. 5

| | | | | |
|---|---|---|---|---|
| Ra | 99.0 | | Ra | 98.5 |
| R1 | 98.8 | | R1 | 99.4 |
| R2 | 99.7 | | R2 | 99.1 |
| R3 | 98.5 | | R3 | 98.8 |
| R4 | 98.3 | | R4 | 98.9 |
| R5 | 98.9 | | R5 | 99.3 |
| R6 | 98.6 | | R6 | 98.1 |
| R7 | 99.9 | | R7 | 97.6 |
| R8 | 99.5 | | R8 | 96.7 |
| R9 | 98.7 | | R9 | 93.1 |
| R10 | 99.5 | | R10 | 98.7 |
| R11 | 97.0 | | R11 | 99.4 |
| R12 | 98.2 | | R12 | 96.1 |
| R13 | 99.2 | | R13 | 99.5 |
| R14 | 98.7 | | R14 | 99.8 |
| R15 | 99.5 | | R15 | 98.9 |

(a)         (b)

(a)

(b)

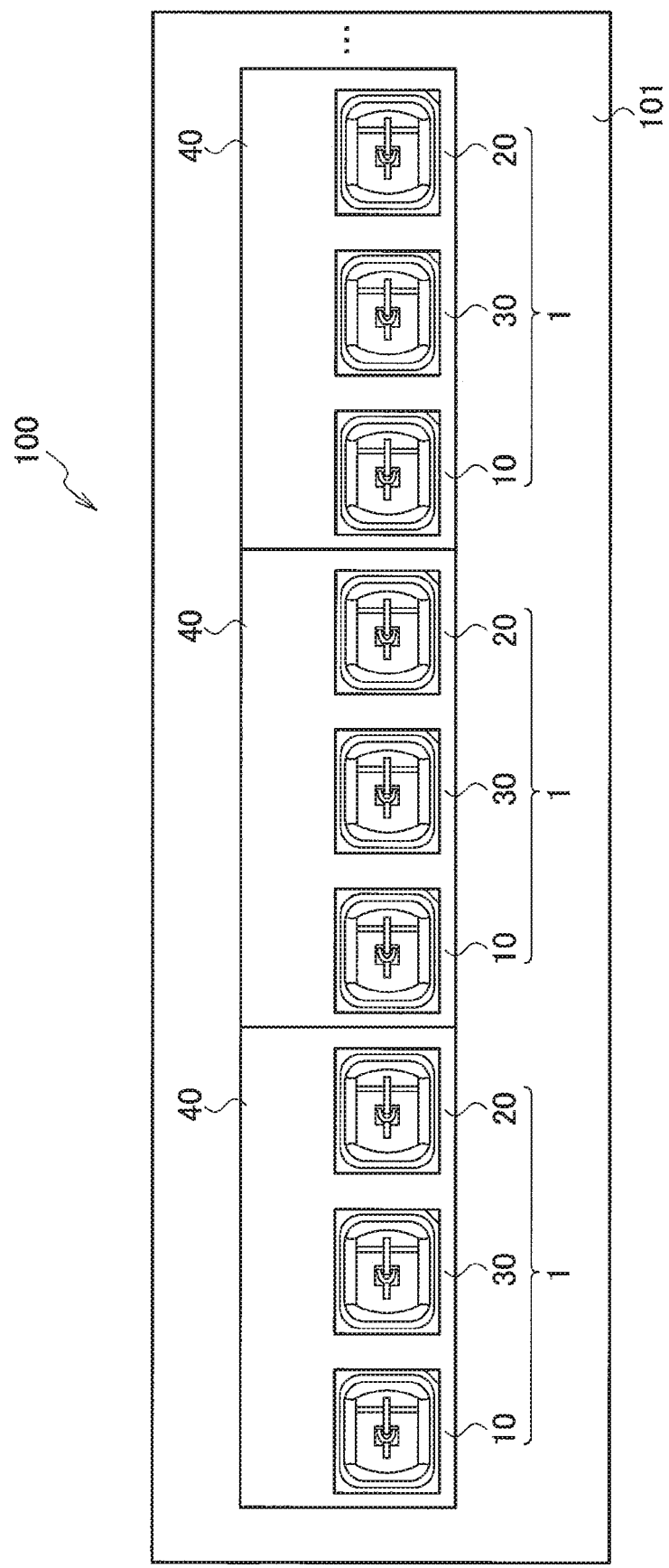

LIGHT EMITTING DEVICE AND LIGHTING DEVICE

TECHNICAL FIELD

The invention relates to a light emitting device and a lighting device that output light by exciting a phosphor with a light emitting element.

RELATED ART

Background Art

Light emitting devices that include light emitting elements, such as light emitting diodes (LEDs), and phosphor excited with the light emitting elements are in practical use. In an LED lighting appliance of about 2500 to 7500 K, for example, desired chromaticity points comparatively following black body radiation are implemented by a combination of light emission spectra of light emitted from the LED and light emitted from the phosphor. Herein, light emissions of black body radiation and sunlight (approximates black body radiation) exhibit continuous spectra by their nature. On the other hand, general LED white light has a combination of spectra, that is, a discontinuous synthetic spectrum. LED white light therefore exhibits different quality from light emission of black body radiation even if having the same chromaticity.

In terms of the quality of light, such as color rendering properties, reflected colors of black body radiation or daylight are the most preferable. There are some methods to evaluate the quality of light using black body radiation or daylight as an index of 100. The most popular one of such evaluation methods is color rendering indices (CRIs) determined by the International Commission on Illumination (CIE). CRIs evaluate differences in a color space between irradiation of 15 types of test colors (R1 to R15) with objective light and irradiation with reference light (black body radiation or daylight) corresponding to desired color temperature. The results of evaluation are represented by a general color rendering index Ra (the average of R1 to R8) and special color rendering indices Ri (i=9 to 15).

In order to improve color rendering properties of LED lighting, various measures have been made. In such measures, there is an attempt to implement extremely high color rendering properties comparable to AAA fluorescent lamps (Ra>95, Ri>90 (JIS Z9112:Ri>88)) or higher. The Japanese government project, "Light of the 21st Century" (1998-2002) and the like have proposed a method (violet excitation) of representing the visible range through excitation of R, G, and B phosphors and the like by using a near ultraviolet or violet LED chip as a light source. This method is still the mainstream in developing LEDs of extremely high color rendering properties (see Patent Literature 1, for example).

Herein, in LED lighting devices of about 2500 to 7500 K, designing all the general color rendering index Ra and special color rendering indices Ri to have high values (not lower than 90, for example) is nothing else that the continuous spectrum of black body radiation or sunlight determined by the CIE, at color temperature of interest, is approximately expressed by LEDs and phosphors. In other words, a continuous spectrum is represented by a combination of discontinuous spectra. The easiest way thereof is to form a visible region (a blue to red wavelength range) by using near-ultraviolet LED chips as light sources and several types of phosphors having a large full width at half maximum (FWHM).

However, lighting devices which generate blue light by phosphor conversion cannot provide enough brightness necessary as illumination due to the conversion loss. In addition, the number and types of phosphors that are excited with near-ultraviolet light and provide high conversion efficiency while having a large FWHM at allowed transition are limited. It is therefore difficult to implement desired spectral continuity.

On the other hand, as a method to produce white light of comparatively high color rendering properties by using blue light emitting elements as light sources, some types of light emitting devices are configured to use blue to blue-green light emitting elements having plural wavelength peaks in the blue wavelength range, in which the spectrum tends to be discontinuous and discrete, as illustrated in the following prior arts (see Patent Literatures 2 and 3).

CITATION LIST

Patent Literature

Patent Literature 1: Japanese Patent Laid-open Publication No. 2011-29497
Patent Literature 2: Japanese Patent Laid-open Publication No. 2008-34188
Patent Literature 3: Japanese Patent Laid-open Publication No. 2011-192738

SUMMARY OF INVENTION

Technical Problem

However, the configurations of the devices illustrated in Patent Literatures 2 and 3 above are limited. This is because it is substantially impossible for the spectrum in the blue to blue green range to approximate the continuous solar spectrum by using plural blue light emission elements having small FWHM in the spectra. In addition, it is extremely difficult to design and control phosphor spectra through plural excitation light sources of different wavelengths. It is therefore difficult to stably implement high CIE color rendering indices for all the test colors (R1 to R15).

An object of the invention is to provide a light emission device and a lighting device which are able to emit white light using blue light elements as excitation light sources while implementing extremely high color rendering properties and high luminous efficiency.

Solution to Problem

According to an aspect of the invention, a light emitting device includes:

three or more light emitting units which individually include a blue light emitting element, a wavelength range of the blue light emitting element accommodated in respective packages being different from each other. The light emitting device mixes output lights from the light emitting units to output white light of a predetermined chromaticity, in an xy chromaticity diagram, the chromaticity of the output light from each of the light emitting units is located at a distance from the predetermined chromaticity, and the difference between the chromaticity of the output light from each of the light emitting units and the predetermined chromaticity is not greater than 0.04.

According to another aspect of the invention, a lighting device includes:

a lighting appliance equipped with a plurality of light emitting devices, each of the plurality of light emitting devices including three or more light emitting units which individually include a blue light emitting element, a wavelength range of the blue light emitting element accommodated in respective packages being different from each other.

Each of the plurality of light emitting devices mixes output lights from the light emitting units to output white light of a predetermined chromaticity, in an xy chromaticity diagram, the chromaticity of the output light from each of the light emitting units is located at a distance from the predetermined chromaticity, and the difference between the chromaticity of the output light from each of the light emitting units and the predetermined chromaticity is not greater than 0.04.

Advantageous Effects of Invention

The invention has been focused on the sub-peak of the color matching function (red) x-bar. The function (light emitting elements) mainly sensitive to the red wavelength range also has a certain degree of sensitivity to the blue wavelength range. The wavelength and spectrum of three or more blue light emitting elements are therefore closely examined, to implement higher color rendering properties, that is, increase the color rendering indices R9 and R12 in particular.

BRIEF DESCRIPTION OF DRAWINGS

FIGS. 5($a$) and 5($b$) illustrate examples of simulation results, FIG. 5($a$) is a table illustrating color rendering indices of output light from the light emitting device according to the first embodiment, FIG. 5($b$) is a table illustrating color rendering indices of output light from the light emitting device of the comparative example.

FIG. 12 is a schematic diagram illustrating a configuration example of a lighting device according to a second embodiment of the invention.

DESCRIPTION OF EMBODIMENTS

Next, embodiments of the invention are described with reference to the drawings. In the following description of the drawings, the same or similar portions are given the same or similar symbols. The embodiments below exemplify devices and methods to embody the technical idea of the invention. The technical idea of the invention will not specify the shape, structure, and arrangement of constituent components and the like to ones described below. Various changes can be added to the embodiments of the invention within the claims.

In a first embodiment described later, a light emitting device including three light emitting units is illustrated as a light emitting device including blue light emitting elements of at least three different wavelength ranges. In the second embodiment, a lighting device including a plurality of light emitting devices according to the first embodiment is described.

First Embodiment

Figure 1:
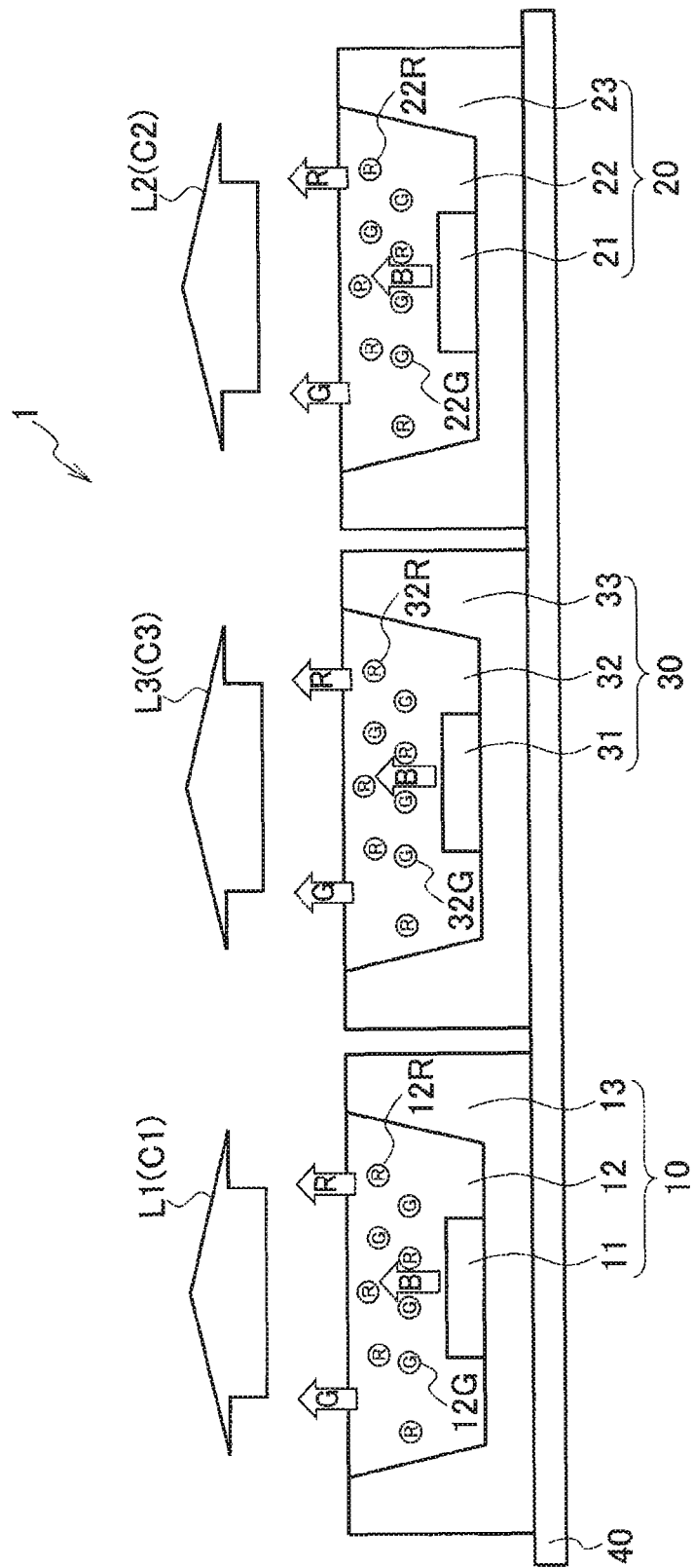
FIG. 1 is a schematic diagram illustrating a configuration example of a light emitting device according to a first embodiment of the invention.

As illustrated in FIG. 1, a light emitting device 1 according to the first embodiment of the invention includes a first light emitting unit 10 that outputs white light (output light) L1 having a first chromaticity C1; a second light emitting unit 20 that outputs white light L2 having a second chromaticity C2; and a third light emitting unit 30 that outputs white light L3 having a third chromaticity C3. The third light emitting unit 30 is placed between the first and second light emitting units 10 and 20, for example.

The light emitting device 1 of FIG. 1 mixes (combines) the white light L1 from the first light emitting unit 10, the white light L2 from the second light emitting unit 20, and the white light L3 from the third light emitting unit 30 to output synthesized light (white light) having a predetermined chromaticity. The first, second, and third light emitting units 10, 20, and 30 are placed close to each other so that the white light L1, white light L2, and white light L3 are mixed.

In an xy chromaticity diagram, the first, second, and third chromaticities C1, C2, and C3 are substantially equidistant from a predetermined chromaticity (described later in detail). The difference between each of the first, second, and third chromaticities C1, C2, and C3 and the predetermined chromaticity is not greater than 0.04.

For convenience of explanation, the first, second, and third chromaticities C1, C2, and C3 are described as chromaticity points. Actually, the first, second, and third light emitting units 10, 20, and 30 are manufactured so that the first, second, and third chromaticities C1, C2, and C3 fall within about 4-step MacAdam ellipses around the respective chromaticity centers and are used in combination so that the chromaticity thereof fall within an about 3-step MacAdam ellipse.

The differences between the predetermined chromaticity and the first, second, and third chromaticities C1, C2, and C3 indicate lengths between the position of the predetermined chromaticity and the positions of the first, second, and third chromaticities C1, C2, and C3, respectively. The first, second, and third chromaticities C1, C2, and C3 are located at substantially an equal distance from the predetermined chromaticity interposed therebetween. The lengths between the position of the predetermined chromaticity and the positions of the first, second, and third chromaticities C1, C2, and C3 are determined depending on the brightness of the white light L, white light L2, and white light L3, respectively.

Herein, the first, second, and third chromaticities C1, C2, and C3 are located at vertices that form a substantially equilateral triangle. The angles between the line segments connecting the first, second, and third chromaticities C1, C2, and C3 and the predetermined chromaticity are 120 degrees (described later in detail).

In FIG. 1, the first light emitting unit 10 includes: a first blue light emitting element 11 that emits first emission light; and a first phosphor layer 12 that is excited with the first emission light to emit first excitation light. The peak wavelength in the emission spectrum of the first emission light is a first wavelength. The first light emitting unit 10 outputs a mixture of the first emission light and first excitation light as the white light L1 having the first chromaticity C1. The first phosphor layer 12 includes phosphors, such as green phosphors 12G and red phosphors 12R. The components and composition of the phosphors are determined so that the first light emitting unit 10 outputs the white light L1 having the first chromaticity C1. The first light emitting unit 10 outputs, as output light, a mixture of blue light emitted from the first blue light emitting element 11, green light emitted from the green phosphors 12G, and red light emitted from the red phosphors 12R.

The second light emitting unit 20 includes: a second blue light emitting element 21 that emits second emission light; and a second phosphor layer 22 that is excited with the second emission light to emit second excitation light. The peak wavelength in the emission spectrum of the second emission light is a second wavelength. The second light emitting unit 20 outputs a mixture of the second emission light and second excitation light as the white light L2 having the second chromaticity C2. The second phosphor layer 22 includes phosphors, such as green phosphors 22G and red phosphors 22R. The components and composition of the phosphors are determined so that the second light emitting unit 20 outputs the white light L2 having the second chromaticity C2. The second light emitting unit 20 outputs, as output light, a mixture of blue light emitted from the second blue light emitting element 21, green light emitted from the green phosphors 22G, and red light emitted from the red phosphors 22R.

The third light emitting unit 30 includes: a third blue light emitting element 31 that emits third emission light; and a third phosphor layer 32 that is excited with the third emission light to emit third excitation light. The peak wavelength in the emission spectrum of the third emission light is a third wavelength. The third light emitting unit 30 outputs a mixture of the third emission light and third excitation light as the white light L3 having the third chromaticity C3. The third phosphor layer 32 includes phosphors, such as green phosphors 32G and red phosphors 32R. The components and composition of the phosphors are determined so that the third light emitting unit 30 outputs the white light L3 having the third chromaticity C3. The third light emitting unit 30 outputs, as output light, a mixture of blue light emitted from the third blue light emitting element 31, green light emitted from the green phosphors 32G, and red light emitted from the red phosphors 32R.

Herein, the peak wavelength refers to a wavelength at which the intensity is maximized in an emission spectrum.

The first, second, and third phosphor layers 12, 22, and 32 are normally different in components and composition of the contained phosphors. This is because the first, second, and third blue light emitting elements 11, 21, and 31 are different in peak wavelength in the emission spectra. The third wavelength, as the peak wavelength of the emission light from the third blue light emitting element 31, is longer than the first wavelength, as the peak wavelength of the emission light from the first blue light emitting element 11 and is shorter than the second wavelength, as the peak wavelength of the emission light from the second blue light emitting element 21, for example. As described later, the difference between the first and second wavelengths is preferably not shorter than 20 nm.

In the following description, the first, second, and third blue light emitting elements 11, 21, and 31 are collectively referred to as blue light emitting elements. The blue light emitting elements are InGaN blue LED chips, for example.

As illustrated in FIG. 1, for example, the first light emitting unit 10 has a structure in which a first package 13 includes a recessed portion and the first blue light emitting element 11 is placed on the bottom of the recessed portion. The recessed portion of the first package 13 is filled with the first phosphor layer 12. The second light emitting unit 20 has the same structure as that of the first light emitting unit 10. A second package 23 includes a recessed portion, and the second blue light emitting element 21 is placed on the bottom of the recessed portion. The recessed portion of the second package 23 is filled with the second phosphor layer 22. The third light emitting unit 30 also has the same structure as that of the first and second light emitting units 10 and 20. A third package 33 includes a recessed portion, and the third blue light emitting element 31 is placed on the bottom of the recessed portion. The recessed portion of the third package 33 is filled with the third phosphor layer 32.

The first, second, and third phosphor layers 12, 22, and 32 are made of silicon resin or the like that contains phosphors. In the following description, the first, second, and third light emitting units 10, 20, and 30 are collectively referred to as light emitting units.

The first, second, and third packages 13, 23, and 33 are mounted on a substrate 40. In the substrate 40, not-illustrated electric wires are laid. The electric wires connect to the first, second, and third blue light emitting elements 11, 21, and 31. When voltage is applied to the first, second, and third blue light emitting elements 11, 21, and 31 through the electric wires, driving current flows, and the first, second, and third blue light emitting elements 11, 21, and 31 emit light.

As already described, the first, second, and third blue light emitting elements 11, 21, and 31 are different in peak wavelength in the emission spectra. The spectrum in the blue light range can be designed corresponding to the sub-peak of the color matching function (red) x-bar (described later). This increases the color rendering indices R9 (red) and R12 (blue), which tend to be low.

Figure 2:
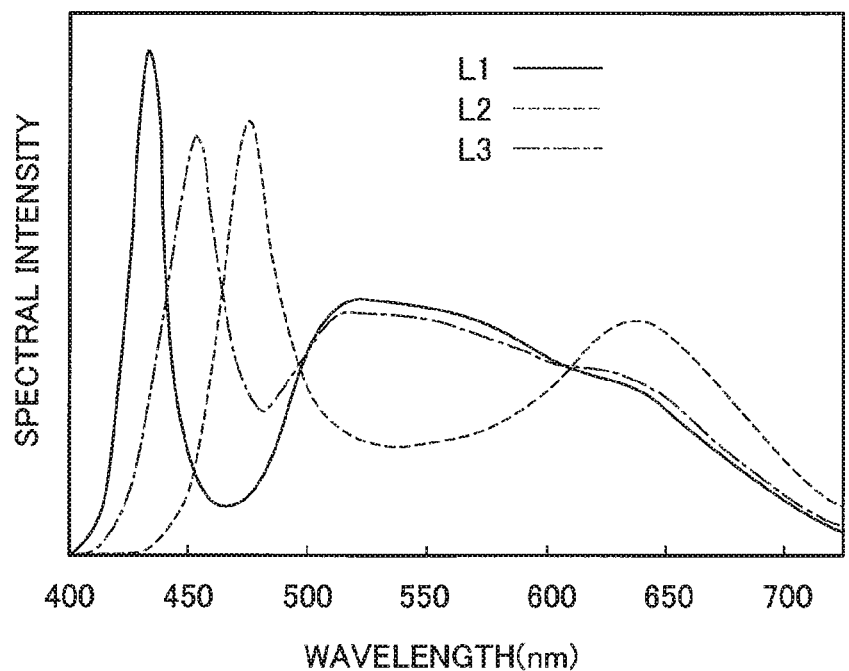
FIG. 2 is a graph illustrating emission spectrum examples of output light from first to third light emitting units of a light emitting device according to the first embodiment.
Figure 3:
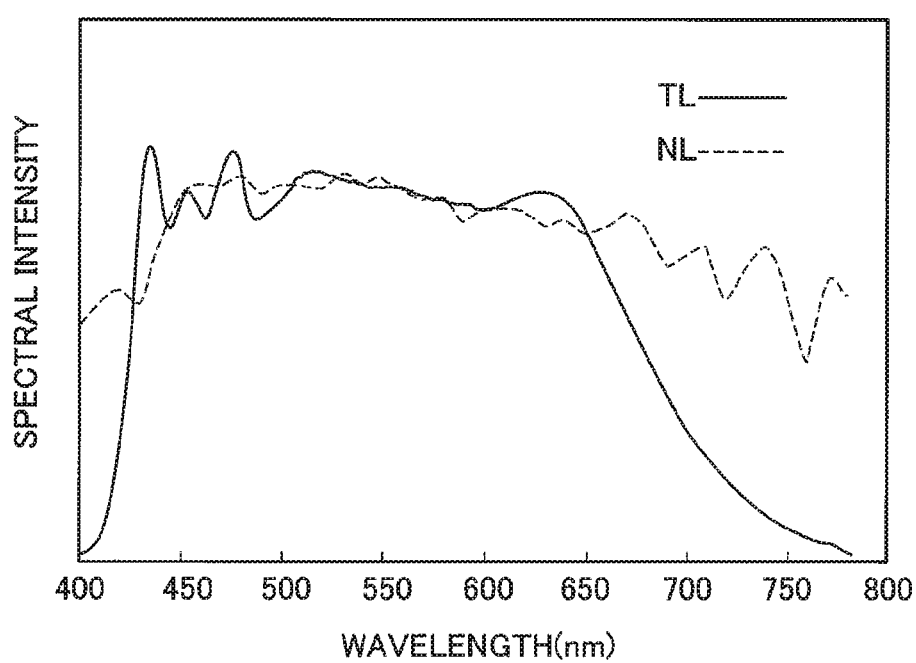
FIG. 3 is a graph illustrating an emission spectrum example of white light obtained by mixing output lights from the first, second, and third light emitting units of the light emitting device according to the first embodiment, in comparison with the CIE daylight spectrum.

Next, mixing of white lights obtained by using at least three blue light emitting elements having different peak wavelengths is described below. FIG. 2 compares the emission spectrum of the white light L1 by the first light emitting unit 10, which includes the first blue light emitting element 11 and first phosphor layer 12, the emission spectrum of the white light L2 by the second light emitting unit 20, which includes the second blue light emitting element 21 and second phosphor layer 22, and the emission spectrum of the white light L3 by the third light emitting unit 30, which includes the third blue light emitting element 31 and third phosphor layer 32. FIG. 3 compares an emission spectrum TL of white light (output light) of a predetermined chromaticity, which is obtained by mixing the white light L1, white light L2, and white light L3, with a CIE daylight spectrum NL. In FIGS. 2 and 3, the horizontal axes represent wavelength while the vertical axes represent spectral intensity. The CIE daylight spectrum NL refers to a continuous referential light spectrum like the spectrum of light emission of black body radiation or sunlight (natural light).

As illustrated in FIG. 2, the wavelength range of the blue LED chips is assumed to be 430.0 to 480.0 nm. In the first light emitting unit 10, the combination of the first blue light emitting element 11 and first phosphor layer 12 is determined so that the peak wavelength of the emission spectrum of the white light L1 falls in a short-wavelength range, such as about 430.0 to 445.0 nm, for example. In the second light emitting unit 20, the combination of the second blue light emitting element 21 and second phosphor layer 22 is determined so that the peak wavelength of the emission spectrum of the white light L2 falls in a long-wavelength range, such as about 465.0 to 480.0 nm, for example. In the third light emitting unit 30, the combination of the third blue light emitting element 31 and third phosphor layer 32 is determined so that the peak wavelength of the emission spectrum of the white light L3 falls in an intermediate wavelength range, such as about 445.0 to 465.0 nm, for example.

The spectrum TL of the white light obtained by mixing the white light L1, white light L2, and white light L3 therefore approximates the CIE daylight spectrum NL, which is determined by the CIE, as illustrated in FIG. 3. The daylight spectrum NL has a general color rendering index Ra of 100.

Figure 4:
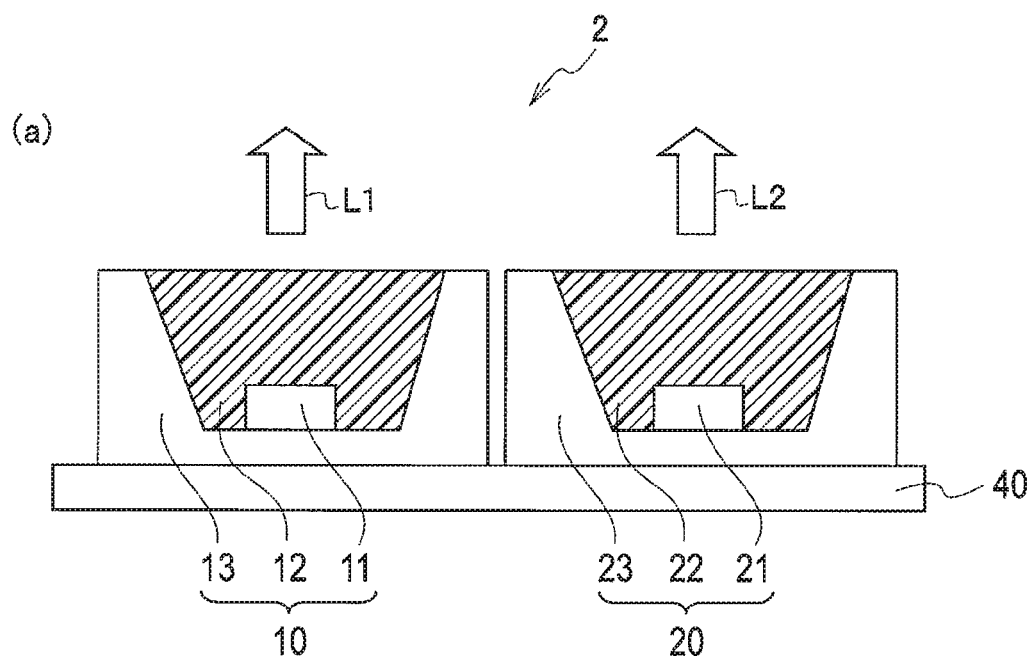
FIG. 4($a$) is a schematic diagram of a light emitting device of a comparative example illustrated for comparison, and FIG. 4($b$) is a graph illustrating the emission spectrum of output light from the light emitting device of the comparative example.
Figure 4:
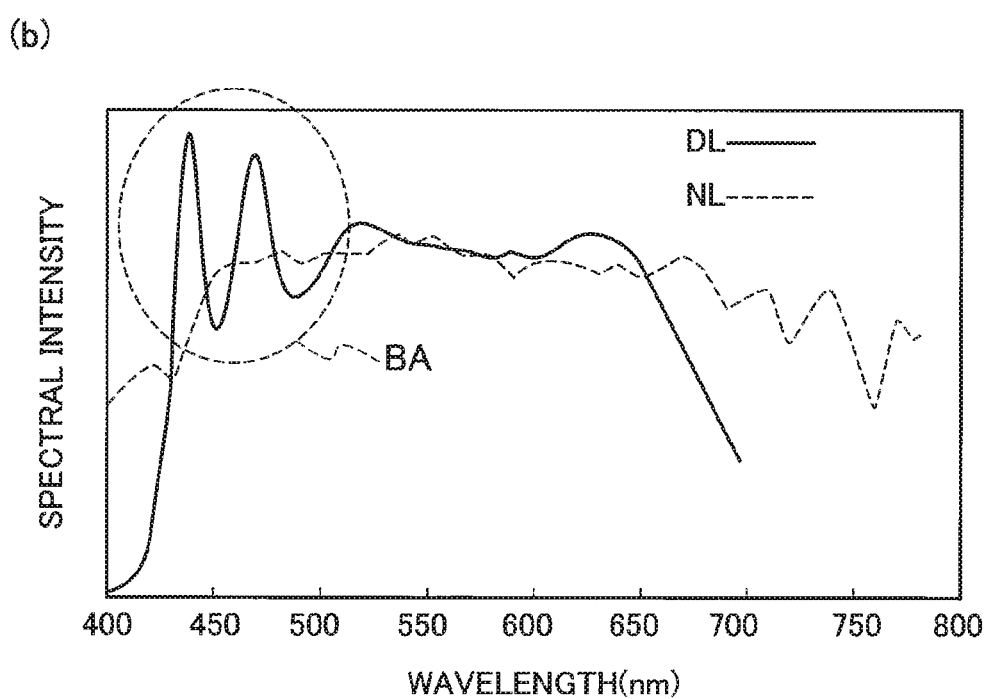

FIG. 4(a) illustrates a high color-rendering light emitting device 2 (see Japanese Patent Laid-open Publication No. 2016-219519, for example) for comparison with the light emitting device 1 of the first embodiment. The light emitting device 2 is previously invented by the inventors and includes two blue light emitting elements of different peak wavelengths. FIG. 4(a) is a schematic diagram illustrating the light emitting device 2 including the first and second light emitting units 10 and 20 mounted on the substrate 40, as a comparative example. FIG. 4(b) is a graph illustrating a comparison of the emission spectrum DL of white light from the light emitting device 2 as the comparative example with the CIE daylight spectrum NL. The horizontal axis of FIG. 4(b) represents wavelength while the vertical axis represents spectral intensity. In the light emitting device 2 as the comparative example, the first light emitting unit 10 is configured so that the peak wavelength of the emission spectrum of the white light L1 falls in about 440.0 to 442.5 nm, for example. The second light emitting unit 20 is configured so that the peak wavelength of the emission spectrum of the white light L2 falls in about 465.0 to 467.5 nm, for example.

As seen in the graph of FIG. 4(b), in the case of the light emitting device 2 of the comparative example, the shape (concave and convex waveform) of the emission spectrum DL, which is composed of the emission spectra of the white light L1 and white light L2, is greatly different from the shape of the CIE daylight spectrum NL especially in the blue light range of the color matching functions (the blue wavelength range indicated by BA).

According to the light emitting device 1 of the first embodiment illustrated in FIG. 3, by closely examining the wavelength of the white light L3, the range between the emission spectra of the white light L1 and the white light L2, that corresponds to the blue wavelength range in the spectrum TL, can further approximate the CIE daylight spectrum NL. This can provide high color rendering synthesized light as white light closer to natural light even when the white light L1, white light L2, and white light L3 individually have low color-rendering properties.

FIG. 5(a) illustrates color rendering indices of the light emitting device 1 of the first embodiment, and FIG. 5(b) illustrates color rendering indices of the light emitting device 2 of the comparative example. In the example illustrated in FIG. 5(a), the peak wavelength in the emission spectrum of the white light L1 from the first light emitting unit 10 is adjusted to about 440.0 to 445.0 nm; the peak wavelength in the emission spectrum of the white light L2 from the second light emitting unit 20 is adjusted to about 472.5 to 475.0 nm; and the peak wavelength in the emission spectrum of the white light L3 from the third light emitting unit 30 is adjusted to about 452.5 to 455.0 nm.

In the example illustrated in FIG. 5(a), the difference between the predetermined chromaticity and each of the first chromaticity C1 of the first light emitting unit 10, the second chromaticity C2 of the second light emitting unit 20, and the third chromaticity C3 of the third light emitting unit 30 is set to not less than 0.015 and not greater than 0.04 (described in detail later).

By employing the configuration of the light emitting device 1 according to the first embodiment, the color rendering indices R9 and R12 in particular are expected to be further improved among the special color rendering indices Ri (i=9 to 15), as seen in FIG. 5(a).

Specifically, the light emitting device 2 of the comparative example illustrated in FIG. 4(a), as illustrated in FIG. 5(b), provides a higher luminous efficiency than that of a light emitting device including super-high color rendering near-ultraviolet or violet LED chips and is less prone to ultraviolet degradation. However, there is a limit how closely the radiation spectrum of the light emitting device 2 approximate the solar radiation spectrum (reference light spectrum) (see FIG. 4(b)) in the way that violet excitation can.

In the followings, excitation in light emitting devices including near ultraviolet to violet LED chips is referred to as violet excitation while excitation in light emitting devices including blue LED chips is referred to as blue excitation. Color rendering properties are quantified by a color difference ΔE between illumination light and reference light. Color rendering properties represent the level of reproduction of colors in daylight (reference light). White light of high reproducibility is referred to as high color rendering property light. White light is referred to as ultra-high color rendering property light when the general color rendering index Ra is not less than 95 (Ra>=95) and color rendering indices Ri (i=9 to 15) are greater than 90 (Ri>90).

The decisive factors for color rendering properties include the spectral power distribution (the radiation spectrum) for light sources such as illumination light, spectral reflectivity for illuminated objects, and cone spectral sensitivity (color matching functions) in terms of visual sense.

Herein, the color rendering indices Ri are obtained by subtracting color difference ΔE of each of 15 types of test colors (R1 to R15), which are determined by the CIE, from the sunlight (reference light) value of 100. The color rendering indices Ri are calculated by the following expression (1).

$$Ri=100-4.6\times\Delta E(i=1 \text{ to } 15) \quad (1)$$

Herein, the color difference ΔE=(color in the reference light)–(color in illumination light).

The general color rendering index Ra is the average of the color rendering indices R1 to R8 and is calculated by the following expression (2).

$$Ra=(R1+R2+\ldots+R8)/8 \quad (2)$$

Next, a description is given of a method to improve the color rendering properties of blue excitation-type light emitting devices.

As described above, the configuration of the light emitting device 2 of the comparative example cannot improve in color rendering properties only by causing the spectral power distribution to approximate the solar radiation spectrum, unlike the case of violet excitation.

Figure 6:
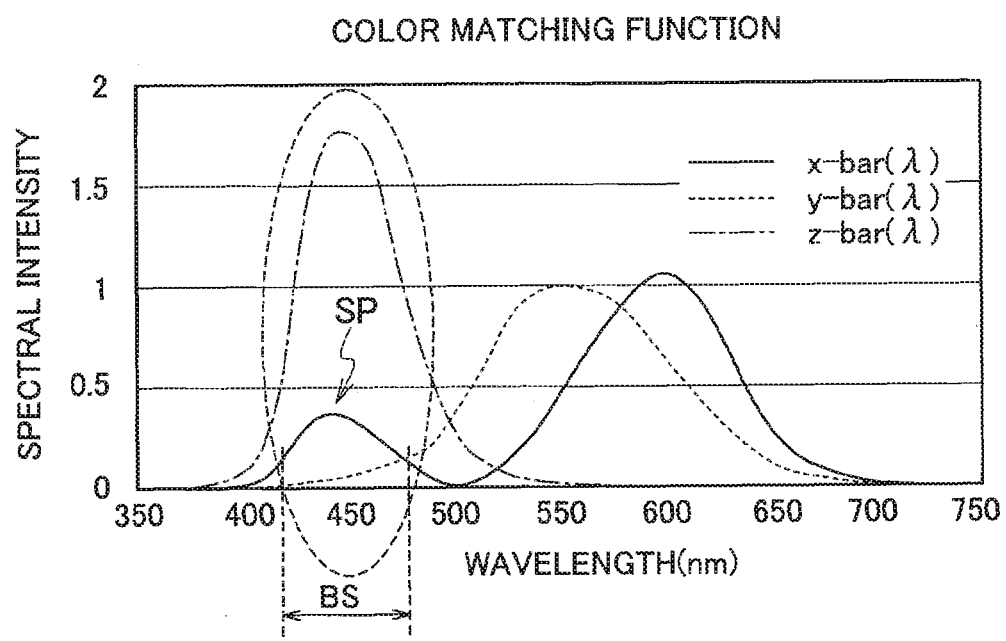
FIG. 6 is a graph illustrating examples of color matching functions.

In the light emitting device 1 according to the first embodiment, attention is focused on the sub-peak SP of x-bar (red) of the color matching functions (nearly equal to the cone sensitivity spectrum) as illustrated in FIG. 6. This sub-peak SP appears near the blue wavelength range (435.0 to 480.0 nm, for example) BS as illustrated in FIG. 6. This means that the function sensitive to mainly the red wavelength range exhibits a certain degree of sensitivity to the blue wavelength range. By examining the wavelength and spectrum of three or more blue light emitting elements, therefore, the color rendering properties, especially the color rendering indices R9 and R12, are expected to be higher than those of the light emitting device 2 of the comparative example.

Figure 7:
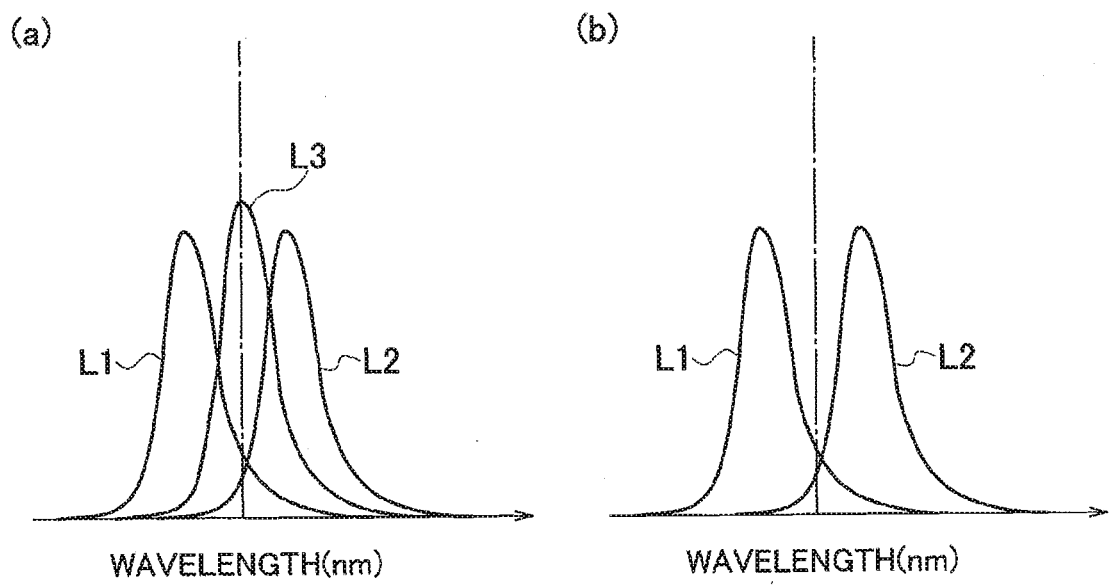
FIGS. 7($a$) and 7($b$) are graphs illustrating peak intensity examples in emission spectra of output light from the light emitting device according to the first embodiment and output light from the light emitting device of the comparative example, respectively.

As illustrated in FIG. 7(b), the peak intensity in the emission spectrum of the light emitting device 2 of the comparative example is represented by the white light L1 and white light L2. On the other hand, as illustrated in FIG. 7(a), the peak intensity in the emission spectrum of the light emitting device 1 of the first embodiment is represented by the white light L1, white light L2, and white light L3. By employing the white light L1, white light L2, and white light L3 of three wavelength ranges in such a manner, the spectrum shape can be controlled finely. This solves the color rendering issue of the color rendering indices R9 and R12 being low, that is, further optimizes the blue spectrum shape corresponding to the color matching functions.

Herein, a description is given of the results of simulation showing how the color rendering indices R9 and R12 change when the emission spectrum of the blue LED chips changes.

Figure 8:
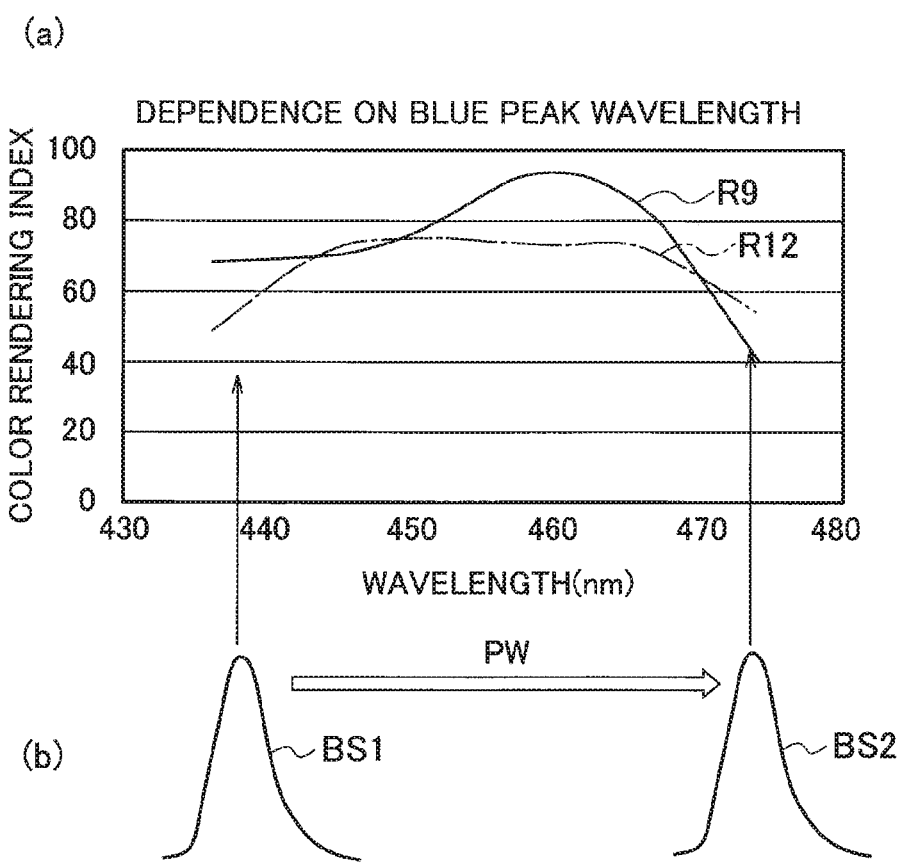
FIG. 8($a$) is a graph illustrating dependence of the color rendering indices R9 and R12 on blue peak-wavelength, and FIG. 8($b$) is a waveform diagram illustrating an example of change in peak wavelength.

FIG. 8 illustrates the results of simulation showing dependence of the color rendering indices R9 and R12 on the blue peak wavelength when the peak wavelength of the blue LED chip virtually changes within a blue wavelength range BS. As illustrated in FIG. 8(b), the peak wavelength of the blue LED chip changes from BS1 to BS2 along an arrow PW. As illustrated in FIG. 8(a), the color rendering index R9 reaches 93 (the maximum value) when the peak wavelength is near the 458.5 nm. The color rendering index R12 is smaller than 90 throughout the range.

Figure 9:
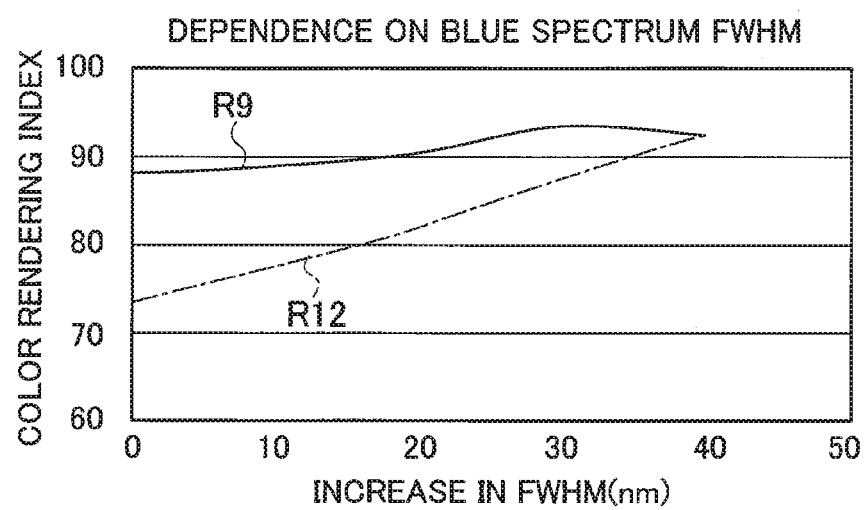
FIG. 9($a$) is a graph illustrating dependence of the color rendering indices R9 and R12 on full width at half maximum in the blue spectrum, and FIG. 9($b$) is a wavelength diagram illustrating an example of an increase in full width at half maximum.
Figure 9:
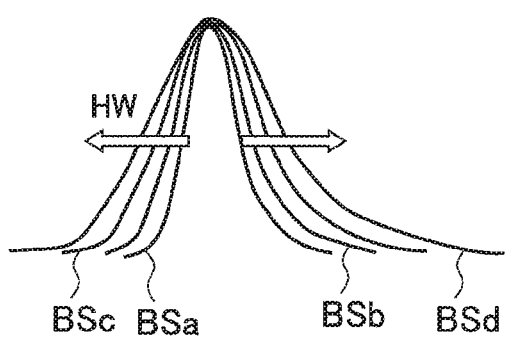

FIGS. 9(a) and 9(b) illustrate the results of simulation showing dependence of the color rendering indices R9 and R12 on full width at half maximum (FWHM) of the blue spectrum. As illustrated in FIG. 9(b), as the spectrum width virtually increases like spectra BSa, BSb, BSc, . . . along arrows HW with peak wavelength λp of the blue LED chip fixed to 460.0 nm, for example, the color rendering index R12 increases monotonically while the color rendering index R9 is saturated.

These results of simulation have revealed that the color rendering indices R9 and R12 can be improved by using at least three blue LED chips of small FWHM in combination and optimizing the spectrum shape in the wavelength range of the blue LED chips, corresponding to the color matching functions. Specifically, optimizing the emission wavelength and FWHM in the spectrum of each blue LED chip can produce output of white light of higher color rendering properties.

Next, a description is given of target chromaticities of the light emitting units.

Figure 10:
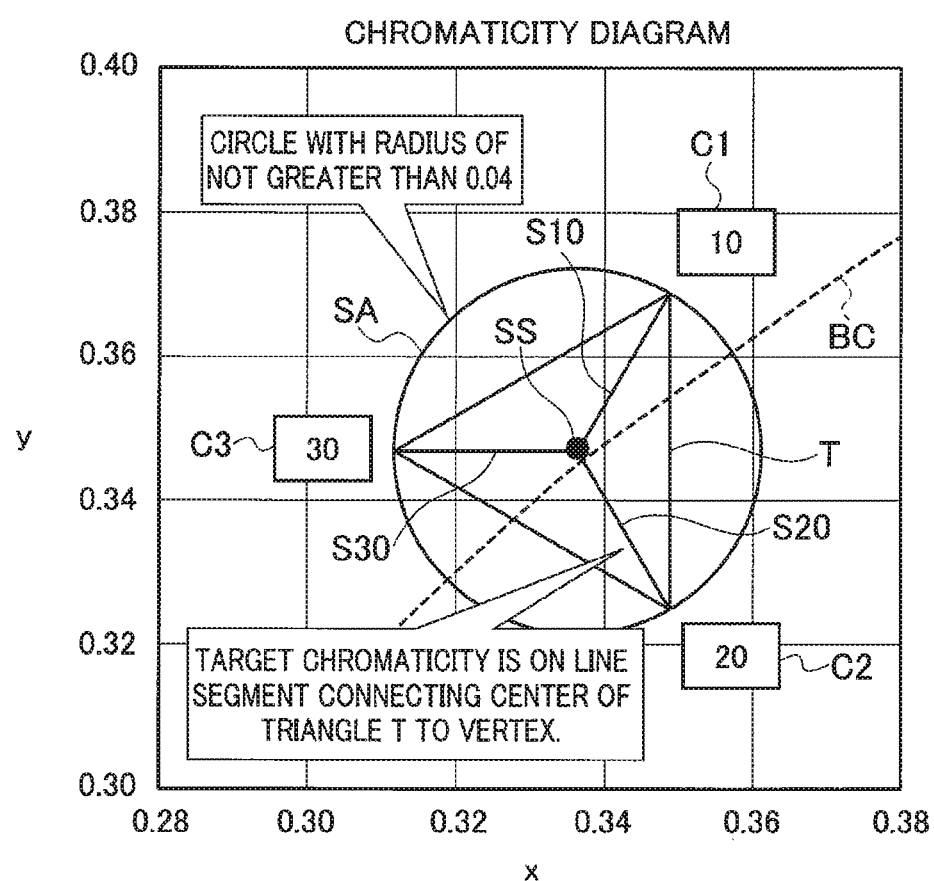
FIG. 10 is an xy chromaticity diagram for explaining target chromaticities of the first, second, and third light emitting units.

FIG. 10 is an xy chromaticity diagram example of the light emitting device 1 according to the first embodiment. In the xy chromaticity example, color temperature BC of the synthesized light of the light emitting device 1 is 5000 K. In addition, the first wavelength of the first blue light emitting element 11 of the first light emitting unit 10 is 435.0 to 445.0 nm; the second wavelength of the second blue light emitting element 21 of the second light emitting unit 20 is 465.0 to 475.0 nm; and the third wavelength of the third blue light emitting element 31 of the third light emitting unit 30 is 445.0 to 465.0 nm.

In the light emitting device 1 according to the first embodiment, the target chromaticity of the first light emitting unit 10 is set at a desired chromaticity position (the first chromaticity C1) the difference (a line segment S10) of which is not greater than 0.04 from the predetermined chromaticity SS as illustrated in the xy chromaticity diagram of FIG. 10. The target chromaticity of the second light emitting unit 20 is set at a desired chromaticity position (the second chromaticity C2) the difference (a line segment S20) of which is not greater than 0.04 from the predetermined chromaticity SS as illustrated in the xy chromaticity diagram of FIG. 10. The target chromaticity of the third light emitting unit 30 is set at a desired chromaticity position (the third chromaticity C3) the difference (a line segment S30) of which is not greater than 0.04 from the predetermined chromaticity SS as illustrated in the xy chromaticity diagram of FIG. 10.

In order to implement high color rendering properties of the light emitting device 1 of the first embodiment, the first light emitting unit 10 is therefore configured so that the chromaticity of the white light L1 is the first chromaticity C1. The second light emitting unit 20 is configured so that the chromaticity of the white light L2 is the second chromaticity C2. The third light emitting unit 30 is configured so that the chromaticity of the white light L3 is the third chromaticity C3.

The first, second, and third chromaticities C1, C2, and C3 are located at vertices of a substantially equilateral triangle. The angles between the line segments S10, S20, and S30, which connect the predetermined chromaticity SS to the first, second, and third chromaticities C1, C2, and C3, respectively, are 120 degrees.

Herein, the first, second, and third chromaticities C1, C2, and C3 are desirably located on the line segments S10, S20, and S30, respectively. The line segments S10, S20, and S30 connect the predetermined chromaticity SS as the center chromaticity to the respective vertices of a substantially equilateral triangle formed on an identical circle SA with the radius set to the line segments S10, S20, and S30. The first, second, and third chromaticities C1, C2, and C3 are substantially equidistant from the predetermined chromaticity SS (S10=S20=S30) around the predetermined chromaticity SS.

It is assumed that the first, second, and third light emitting units 10, 20, and 30 have equal brightness (1:1:1), for example. The synthesized light thereof has a chromaticity at substantially the center of a triangle T. The target chromaticities of the first, second, and third light emitting units 10, 20, and 30 are therefore determined so as to keep the shape of the triangle T around the predetermined chromaticity SS.

In the xy chromaticity diagram illustrated in FIG. 10, the target chromaticities of the first, second, and third light emitting units 10, 20, and 30 are different for adjustment of the shapes of the emission spectra of the white light L1, white light L2, and white light L3.

In the xy chromaticity diagram, the chromaticity lowers in the y and x axes downward and leftward, respectively. In the lower left region, the package includes a small amount of phosphors, and the peak waveform tends to be high. On the other hand, in the xy chromaticity diagram, the chromaticity increases in the y and x axes upward and rightward, respectively. In the upper right region, the package includes a large amount of phosphors, and the peak waveform tends to be low.

Herein, the method of adjusting the target chromaticities is further described with reference to FIG. 11.

Figure 11:
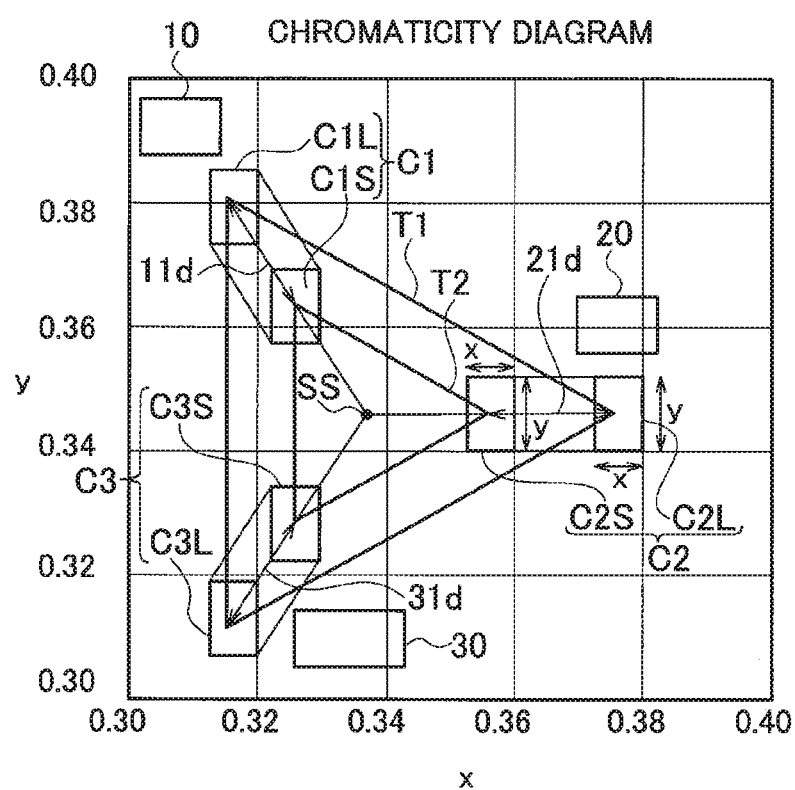
FIG. 11 is an xy chromaticity diagram for explaining an adjustment example of the target chromaticities of the first, second, and third light emitting unit.

The adjustment of the target chromaticities of the first, second, and third light emitting units 10, 20, and 30 for the predetermined chromaticity SS is performed using large and small two equilateral triangles T1 and T2 as illustrated in FIG. 11, for example.

In the first embodiment, each vertex of the large equilateral triangle T1 is located on a not-illustrated circle with the radius set to a distance (0.04, for example) from the predetermined chromaticity SS while each vertex of the small equilateral triangle T2 is located on a not-illustrated circle with the radius set to a distance (0.015, for example) from the predetermined chromaticity SS.

The chromaticity at each vertex includes a range of x±0.01 and y±0.01 taking an account of the chromaticity rank (manufacturing variation). Specifically, the ranges of x±0.01 and y±0.01 taking an account of the chromaticity rank around the respective vertices of the large equilateral triangle T1 are indicated by chromaticity positions C1L, C2L, and C3L. In a similar manner, the ranges of x±0.01 and y±0.01 taking an account of the chromaticity rank around the respective vertices of the small equilateral triangle T2 are indicated by chromaticity positions C1S, C2S, and C3S.

For adjustment of the first chromaticity C1 of the first light emitting unit 10, the distance of the first chromaticity C1 from the predetermined chromaticity SS is adjusted on a line segment 11d, that connects the chromaticity positions C1S and C1L, as illustrated in FIG. 11, for example, so that the difference between the first chromaticity C1 and the predetermined chromaticity SS is set not less than 0.015 and not greater than 0.04. In a similar manner, as for the second chromaticity C2 of the second light emitting unit 20, the distance from the predetermined chromaticity SS is adjusted on a line segment 21d, that connects the chromaticity positions C2S and C2L, as illustrated in FIG. 11, for example, so that the difference between the second chromaticity C2 and the predetermined chromaticity SS is set not less than 0.015 and not greater than 0.04. In a similar manner, as for the third chromaticity C3 of the third light emitting unit 30, the distance from the predetermined chromaticity SS is adjusted on a line segment 31d, that connects the chromaticity positions C3S and C3L, as illustrated in FIG. 11, for example, so that the difference between the third chromaticity C3 and the predetermined chromaticity SS is set not less than 0.015 and not greater than 0.04.

In order to implement high color rendering properties of the light emitting device 1 as illustrated in FIG. 5(a), therefore, the difference between the chromaticity of each of the first, second, and third light emitting units 10, 20, and 30 and the predetermined chromaticity SS is preferably set not greater than 0.04. The color rendering properties of the light emitting device 1 is high especially when the difference between the chromaticity of each of the first, second, and third light emitting units 10, 20, and 30 and the predetermined chromaticity SS is not less than 0.015. Setting the difference between the chromaticity of each of the first, second, and third light emitting units 10, 20, and 30 and the predetermined chromaticity SS not less than 0.015 and not greater than 0.04 is advantageous to implement high color rendering properties.

The difference between the chromaticity of each of the first, second, and third light emitting units 10, 20, and 30 and the predetermined chromaticity SS is not limited to the range of not less than 0.015 and not greater than 0.04. When the first, second, and third light emitting units 10, 20, and 30 are different in brightness, the predetermined chromaticity SS of the synthesized light may be determined by individually adjusting the target chromaticities of the first, second, and third light emitting units 10, 20, and 30.

As described above, the inventors have focused the sub-peak SP of the color matching function (red) x-bar (see FIG. 6). Specifically, the spectrum shape in the blue emission range corresponding to the sub-peak SP of the color matching function x-bar, which influences the color rendering index R9, is optimized (examined) by using blue LED chips of three wavelength ranges. In addition, the shape of the blue emission spectrum is designed to approximate the spectrum shape of sunlight, that approximates black body radiation. It is therefore possible to implement extremely high color rendering properties (including high color rendering or ultra-high color rendering properties) and further increase the color rendering indices R9 and R12 in particular.

In the aforementioned first embodiment, the phosphors include green and red phosphors. However, the phosphors are not limited to those and can include blue phosphors for example. Examples of the red phosphors include aluminum nitride phosphors activated by $Eu^{2+}$ can be used, such as $CaAlSiN_3:Eu^{2+}$ and $(Sr, Ca)AlSiN_3:Eu^{2+}$, and the same kind of phosphors activated by $Eu^{2+}$. Examples of the green phosphors include $Lu_3Al_5O_{12}:Ce^{3+}$, $CaSc_2O_4:Ce^{3+}$, $Ca_3Sc_2Si_3O_{12}:Ce^{3+}$, and the same kind of phosphors activated by $Ce^{3+}$ and $(Ba, Sr)Si_2O_2N_2:Eu^{2+}$ and the same kind of phosphors activated by $Eu^{2+}$. Examples of the blue phosphors include $Sr_4Al_{14}O_{25}:Eu^{2+}$, $BaSi_2O_2N_2:Eu^{2+}$, and the same kind of phosphors activated by $Eu^{24}$.

The light emitting device 1 of the first embodiment may be configured to further include, not only the third light emitting unit 30, but also a fourth light emitting unit, a fifth light emitting unit, and the like while the difference between the first wavelength of the first blue light emitting element 11 of the first light emitting unit 10 and the second wavelength of the second blue light emitting element 21 of the second light emitting unit 20 is set not less than 20 nm.

Second Embodiment

FIG. 12 illustrates a configuration example of a lighting device 100 according to the second embodiment of the invention. In the example of FIG. 12, the light emitting device 1 according to the first embodiment illustrated in FIG. 1 is applied. The same or similar portions are given the same or similar symbols, and the detailed description is omitted.

As illustrated in FIG. 12, the lighting device 100 according to the second embodiment of the invention includes a plurality of the light emitting devices 1 (FIG. 1) that are mounted on a lighting appliance base 101 in a line. The lighting device 100 is covered with an opaque light-diffuser lamp cover (not illustrated) to be finished as an LED lighting apparatus that is able output illumination light (synthesized light) of extremely high color rendering properties.

With the lighting device 100 of the second embodiment, the light emitting devices 1 in which the target chromaticities of the light emitting units are different from each other are configured to emit light simultaneously, producing synthesized light of high (or ultra-high) color rendering properties with a high luminous efficiency. It is therefore possible to implement stable illumination with synthesized light of extremely high color rendering properties even when the light emitting units greatly vary in chromaticity. Under environments where daylight illumination is desired but is not allowable, such as environments of galleries, museums, printing shops, painting sites, medical or care facilities, and the like, for example, the lighting device 100 of the second embodiment is able to reproduce colors in daylight without causing ultraviolet degradation.

The configuration of the second embodiment is not limited to the arrangement of the plural light emitting devices 1 mounted in a line on the lighting appliance base 101. The plural light emitting devices 1 may be mounted in a staggered manner, a stepwise manner, a grid manner, or a circular manner.

Other Embodiments

As described above, the invention is described with the embodiments. However, it should not be understood that the description and drawings constituting part of the disclosure will limit the invention. Various substitutions, examples, and operational techniques will be obvious for those skilled in the art from the disclosure.

It is certain that the invention includes various embodiments not described in the specification. The technical range of the invention is determined by only the matters specifying the claims proper from the above description.

INDUSTRIAL APPLICABILITY

The light emitting device and lighting device of the invention are applicable to various types of light emitting devices and lighting devices that output light by exciting phosphors with light emitting elements.

The invention claimed is:

1. A light emitting device, comprising:
three or more light emitting units which individually include a blue light emitting element, a peak wavelength of the blue light emitting element accommodated in respective packages being different from each other, wherein
the light emitting device mixes and excites output lights from the light emitting units to output white light of a predetermined chromaticity, and
in an xy chromaticity diagram, the chromaticity of the output light from each of the light emitting units is located at a distance from the predetermined chromaticity, and
the difference between the chromaticity of the output light from each of the light emitting units and the predetermined chromaticity is not greater than 0.04.

2. The light emitting device according to claim 1, wherein the light emitting device include at least first, second, and third light emitting units,
the first light emitting unit includes: a first blue light emitting element that emits first emission light exhibiting an emission spectrum in which the peak wavelength is a first wavelength; and a first phosphor layer which is excited with the first emission light to emit first excitation light and
outputs white light of a first chromaticity which is a mixture of the first emission light and the first excitation light,
the second light emitting unit includes: a second blue light emitting element that emits second emission light exhibiting an emission spectrum in which the peak wavelength is a second wavelength, the second wavelength being longer than the first wavelength; and a second phosphor layer which is excited with the second emission light to emit second excitation light and
outputs white light of a second chromaticity which is a mixture of the second emission light and the second excitation light, and
the third light emitting unit includes: a third blue light emitting element that emits third emission light exhibiting an emission spectrum in which the peak wavelength is a third wavelength, the third wavelength being longer than the first wavelength and shorter than the second wavelength; and a third phosphor layer which is excited with the third emission light to emit third excitation light and
outputs white light of a third chromaticity which is a mixture of the third emission light and the third excitation light.

3. The light emitting device according to claim 1, wherein in the xy chromaticity diagram, the difference between the predetermined chromaticity and each of the first, second, and third chromaticities is not less than 0.015.

4. The light emitting device according to claim 1, wherein in the xy chromaticity diagram, angles between line segments that connect the predetermined chromaticity to the respective first, second, and third chromaticities are 120 degrees.

5. The light emitting device according to claim 2, wherein the difference between the first and second wavelengths is not less than 20 nm.

6. The light emitting device according to claim 2, wherein the first wavelength is in a wavelength range from 430.0 to 445.0 nm, the second wavelength is in a wavelength range from 465.0 to 480.0 nm, and the third wavelength is in a wavelength range from 445.0 to 465.0 nm.

7. The light emitting device according to claim 2, wherein in the xy chromaticity diagram, the first, second, and third chromaticities individually have a chromaticity rank of x±0.01 and y±0.01.

8. A lighting device, comprising:
a lighting appliance equipped with a plurality of light emitting devices,
each of the plurality of light emitting devices including three or more light emitting units which individually include a blue light emitting element, a peak wavelength of the blue light emitting element accommodated in respective packages being different from each other, each of the plurality of light emitting devices mixes and excites output lights from the light emitting units to output white light of a predetermined chromaticity, in an xy chromaticity diagram, the chromaticity of the output light from each of the light emitting units is located at a distance from the predetermined chromaticity, and the difference between the chromaticity of the output light from each of the light emitting units and the predetermined chromaticity is not greater than 0.04.

* * * * *